United States Patent
Chi

[19]

[11] Patent Number: 5,981,335
[45] Date of Patent: Nov. 9, 1999

[54] METHOD OF MAKING STACKED GATE MEMORY CELL STRUCTURE

[75] Inventor: Min-Hwa Chi, Hsinchu, Taiwan

[73] Assignee: Vanguard International Semiconductor Corporation, Hsin-Chu, Taiwan

[21] Appl. No.: 08/974,461

[22] Filed: Nov. 20, 1997

[51] Int. Cl.[6] .................... H01L 21/8247; H01L 21/8242
[52] U.S. Cl. ............................................ 438/253; 438/264
[58] Field of Search .................................. 438/253–267; 365/185.28

[56] References Cited

U.S. PATENT DOCUMENTS

| | | |
|---|---|---|
| 5,057,448 | 10/1991 | Kuroda . |
| 5,389,567 | 2/1995 | Acovic et al. .............................. 437/52 |
| 5,399,516 | 3/1995 | Bergendahl et al. . |
| 5,591,658 | 1/1997 | Cacharelis . |
| 5,598,367 | 1/1997 | Noble ....................................... 365/149 |
| 5,612,238 | 3/1997 | Sato et al. . |
| 5,702,988 | 12/1997 | Liang ....................................... 438/238 |
| 5,723,375 | 3/1998 | Ma et al. .................................. 438/258 |

OTHER PUBLICATIONS

B. El Kareh et al, "The Evolution of DRAM Cell Technology", Solid State Technology, May 1997, pp. 89–101.

*Primary Examiner*—Richard A. Booth
*Attorney, Agent, or Firm*—George O. Saile; Stephen B. Ackerman; Billy J. Knowles

[57] ABSTRACT

A stacked gate memory cell having a retention time approaching that of an EEPROM cell and a program and erase time approaching that of a DRAM cell is disclosed. A stacked gate memory cell is fabricated upon a semiconductor substrate by implanting a deep diffusion well in the semiconductor substrate. Next a second diffusion well is implanted in the deep diffusion well. A MOS transistor is formed by implanting a drain diffusion and a source diffusion in the second diffusion well at a channel length apart. The source will be strapped to the second diffusion well. A tunnel oxide is placed on a top surface of the semiconductor substrate in a channel area between the source and drain. A polysilicon gate electrode is placed on the tunnel oxide above the channel area. An insulating layer is then placed on the surface of the semiconductor substrate. A stacked capacitor is formed above the MOS transistor on the surface of the insulating layer. The stacked capacitor has a polysilicon first plate insulating layer and connected by a shorting plug to the gate electrode through an opening in the insulating layer. The gate electrode and the first plate will form a floating gate for the MOS transistor. A capacitor dielectric placed upon the first plate; and a polysilicon second plate on the capacitor dielectric. The second plate will form a control gate for the MOS transistor.

16 Claims, 8 Drawing Sheets

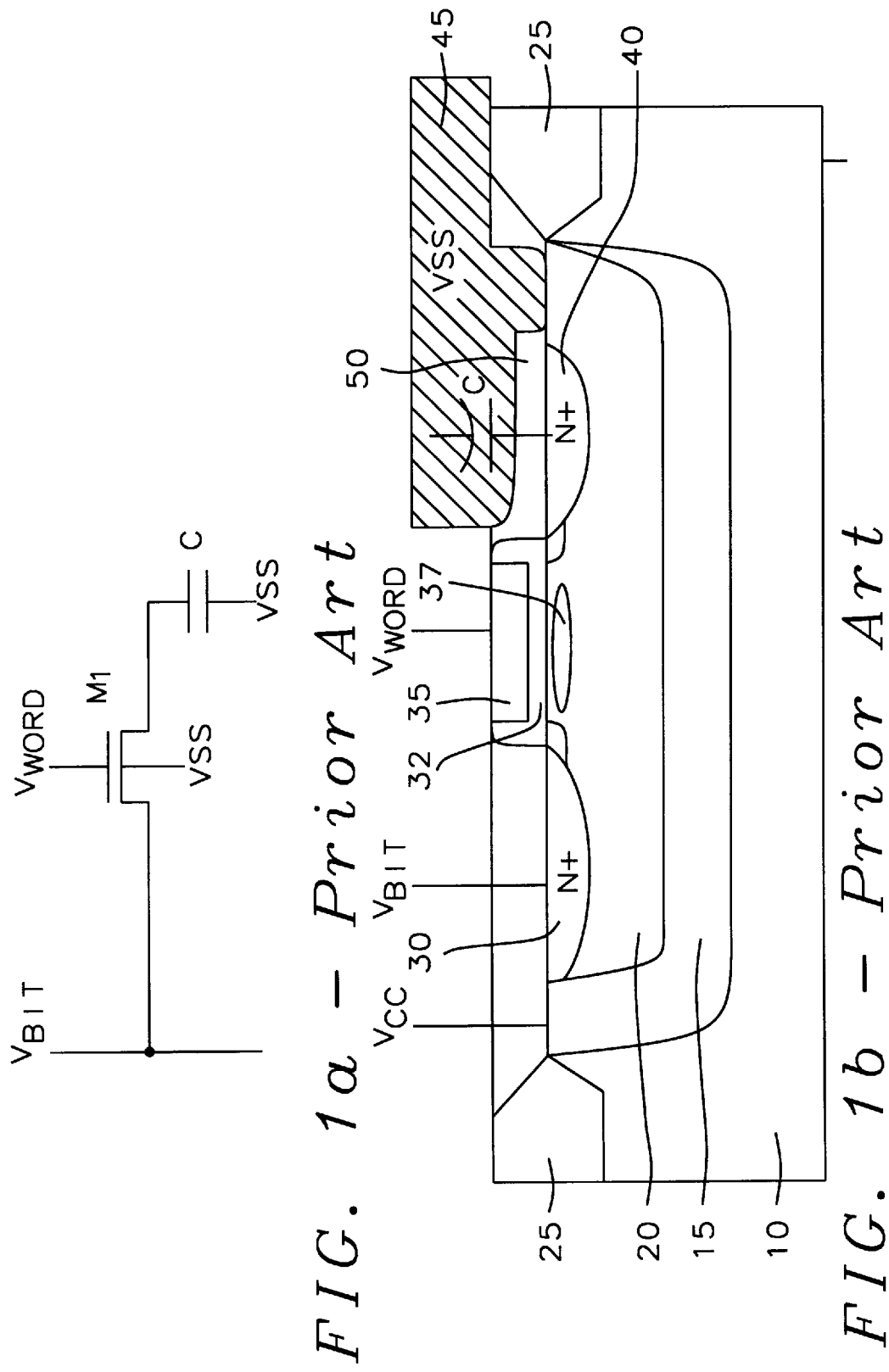
FIG. 1a – Prior Art
FIG. 1b – Prior Art

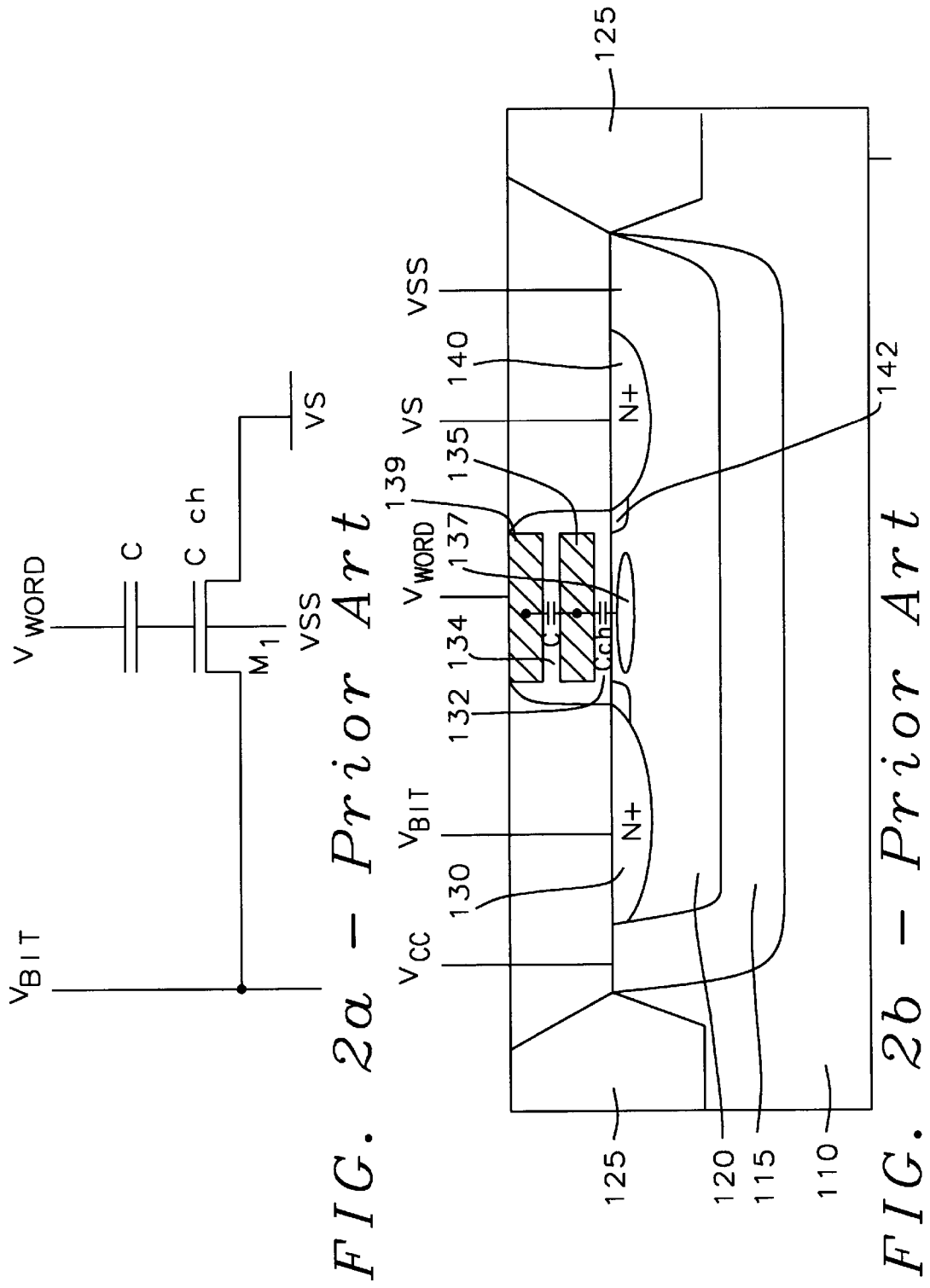
FIG. 2a – Prior Art
FIG. 2b – Prior Art

METHOD OF MAKING STACKED GATE MEMORY CELL STRUCTURE

FIELD OF THE INVENTION

This invention relates to memory cell structures and more particularly to the structures and methods of operation of memory cell structures that have retention times approaching those of a Electrically Eraseable Programmable Read Only Memory (EEPROM) (also referred to as flash memory) and the programming and erase times approaching those of a Dynamic Random Access Memory (DRAM).

DESCRIPTION OF RELATED ART

The fabrication and structure of DRAM cells and DRAM arrays are well known in the art. Typical cell structures for high density DRAM's in prior art is composed of one transistor $M_1$ for switching charges and one storage capacitor C for storing charges is illustrated in FIG. 1a. The transistor $M_1$ will be an n-MOS transistor fabricated in a triple well as shown in FIG. 1b. A deep n-well 15 will be formed in a p-type substrate 10. The area for the deep n-well 15 will be formed as openings during the formation of the insulation are by the local oxidation of the silicon (LOCOS) 25 substrate. Within the n-well 15 a shallower p-well 20 will be formed. The gate 35 of the n-MOS transistor $M_1$ will be formed as a conductive material such as polysilicon placed over an insulating gate oxide 32 to define the channel area that will between the drain 30 and source 40 of the n-MOS transistor $M_1$.

The capacitor C is formed by placing a conductive metal 45 connected to the substrate biasing voltage source on a dielectric 50 placed over the $N^+$ drain 30 of the transistor $M_1$. The capacitor C as shown is diagrammatic. The particular structure of the capacitor C is well known and shown in "The Evolution Of DRAM Cell Technology" by B. El-Kareh et al., Solid State Technology, May 1997, pp. 89–101. In order to maintain the minimum storage capacitance of 30–40 fF of a cell, the structure of the DRAM cell results in complex semiconductor processing to develop these structures.

A corresponding DRAM cell using a p-MOS transistor can certainly be used with polarity and operation bias reversed accordingly.

The deep n-well 15 is typically biased to the power supply voltage source $V_{cc}$ (i.e. the highest potential on chip) and the p-well 20 is biased to substrate biasing voltage source $V_{ss}$ (i.e. the lowest voltage on chip). The substrate biasing voltage source $V_{ss}$ may be biased below ground (i.e. negative potential) so that the leakage current through the pass transistor $M_1$ is reduced. The presence of charge in the storage capacitor C indicates a logical "1" and its absence of charge indicates a logical "0". The storage capacitor C is connected to n+drain 30 of the transistor $M_1$, and the other n+source 40 of the transistor is connected to bit-line $V_{bit}$ that controls the reading and writing of the DRAM cell. The gate of the MOS transistor $M_1$ is connected to the word line $V_{word}$ to control the selection of the DRAM cell.

The fabrication and structure of Eraseable Programmable Read Only Memory (EPROM) or flash memory cells, like the DRAM cells, are well known in the art. The EPROM or flash memory cell of FIG. 2a will be composed on one MOS transistor $M_1$. The gate of the transistor $M_1$ is coupled to the bottom plate of the capacitor C and is also coupled to the channel of capacitor $C_{Ch}$ of FIG. 2a. The construction of the gate of the MOS transistor $M_1$ and the capacitor C is such that a floating gate is formed.

The top plate of the capacitor C is connected to a word line control voltage source $V_{word}$. The top plate of the capacitor C will act as a control gate for the MOS transistor $M_1$. The potential of the floating gate (i.e. the gate of MOS transistor $M_1$) is simply expressed as:

$$V_{fg} = V_{word} + \frac{C}{C+C_{ch}} = V + \gamma$$

where:

$\gamma$ is the coupling ratio of the control gate.

The flash memory cell is similar to the EPROM cell except that it has a thinner tunneling oxide so that it can be electrically erased.

FIG. 2b illustrates a cross-sectional view of a EPROM or flash memory cell of the prior art. The EPROM or flash memory cell is formed within a p-type substrate 110. As with the DRAM cell of FIG. 1b, the area of for the deep n-well 115 will be formed in openings created during forming of the LOCOS insulation 125. Within the deep n-well 115 a shallower p-well 120 will be formed. An $n^+$ drain region 130 and an $n^+$ source region 140 is formed within the p-well 120.

A relatively thin gate oxide 132 is grown on the surface of the substrate 110. The thin gate oxide 132 for flash memory cells is typically 90–120 Å as compared with the thin gate oxide 132 for EPROM which is approximately 150–250 Å. The thin gate oxide 132 of flash memory will facilitate electron tunneling through the thin gate oxide 132 during an erase cycle and will also be referred to as a tunnel oxide, hereinafter. A polysilicon floating gate 135 is formed on the surface of the gate oxide 132 above the channel region 137 between the drain region 130 and source region 140. An interpoly dielectric layer 134 is placed on the floating gate 135 to separate the floating gate 135 from a second layer of polysilicon that forms a control gate 139.

A $p^+$ diffusion is placed in the p-type substrate 110 to provide a low resistance path from a terminal to the p-type substrate 110. The terminal will be attached to a substrate voltage generator Vss. In most application of an EPROM or flash memory, the substrate voltage generator Vss will be set to the ground reference potential (0V).

The source region 140 will be connected to a source control voltage generator $V_s$. The control gate 139 will be connected to the word line control voltage source $V_{word}$. And the $n^+$ drain region 130 will be connected to the bit line voltage source $V_{bit}$.

According to conventional operation, the EPROM or flash memory cell is programmed by setting the word line control voltage generator $V_{word}$ to a relatively high negative voltage (−10V). The bit line control voltage generator $V_{bit}$ is set to a relatively high positive voltage (6V). The source control voltage generator $V_s$ is set to the ground reference potential (0V).

With the voltages as described above, hot electrons will be produced in the channel 137 near the drain 130. These hot electrons will have sufficient energy to be accelerated across the tunnel oxide and trapped on the floating gate. The trapped electrons will cause the threshold voltage of the cell viewed from the control gate of the cell to be increased by three to five volts. This change in threshold voltage by the trapped hot electrons causes the cell to be programmed. This method of programming is commonly known as "channel hot electron" programming.

Another programming method is known as Fowler-Nordheim tunneling. By setting the word line control voltage generator $V_{word}$ to a relatively high positive voltage (15V). The bit line control voltage generator $V_{bit}$ and the source control voltage generator $V_s$ are set to the ground reference potential (0V). This will cause an electric field be formed across the tunneling oxide 132 that has a magnitude of approximately 10 MV/cm. This will cause electrons to tunnel from the drain 130, source 140, and channel 137 to the floating gate 135. The trapped electrons will cause the threshold voltage of the cell to increase to a level that is greater than the power supply voltage source ($V_{cc}$). Typically the timing for Fowler-Nordheim tunneling is greater than 1 msec.

To electrically erase the EPROM or flash memory cell, as shown in FIG. 2b, a positive voltage (approximately $V_{cc}$) is generated by the wordline control voltage generator $V_{word}$. The source control voltage generator $V_s$ is set to the negative of the power supply voltage source ($-V_{cc}$). Under these conditions there is a large electric field developed across the tunnel oxide 132 near the source 140 and the floating gate overlap area 142. This field causes the electrons on the floating gate to be extracted toward the source 140 by the Fowler-Nordheim tunneling mechanism.

An EPROM cell is erased by exposing an array of cell to ultra-violet light. The exposure must be of sufficient time such that the electrons present on the floating gate 135 will gain sufficient energy from the photons of the ultra-violet light so as to escape from the floating gate 135.

The DRAM cell will have bit program and erase time on the order of $10^{-7}$ sec and data retention times on the order 100–1000 msec. After this time if the data has not been refreshed or restored, the charge leakage from the capacitor C of FIG. 1a will be sufficiently large so as to cause loss of data. On the other hand an EPROM or flash memory cell will have program and erase times on the order of 10 msec and data retention times on the order of 10 years. As the scaling trends of the current technology has caused the tunneling oxide to become thinner, leakage currents within the tunneling oxide has caused a decrease in retention times.

U.S. Pat. No. 5,598,367 (Noble) describes a two device non-volatile memory cell. The memory cell comprises a planar FET and a vertical FET in series. The floating gate of the vertical FET will be trench conductor of a standard trench capacitor such as described by B. El-Kareh et al. The control gate function is performed by the buried n-well. The reading of the cell is accomplished by detecting the $V_T$ of the vertical FET.

U.S. Pat. No. 5,389,567 (Acovic et al.) discloses a one transistor non-volatile DRAM cell. The cell has a two layer floating gate to allow the contents of a storage capacitor to be transferred to the floating gate during power interruptions.

The first layer of the floating gate is separated fro the storage node of the storage capacitor by a tunnel oxide to allow electron tunneling between the floating gate and the storage capacitor.

The DRAM cell has four modes of operation (1) DRAM, (2) transfer, (3) non-volatile store, (4) recall/erase. During a power interruption the DRAM cell enters the transfer mode and the data is transferred from the charge storage node to the floating gate. While the power is removed the DRAM cell operate in the non-volatile mode. Once power is restored, the data is recalled and replaced on the storage node and the floating gate is erased.

SUMMARY OF THE INVENTION

An object of this invention is to provide a stacked gate memory cell having a retention time approaching that of an EPROM or flash memory cell.

Another object of this invention is to provide a stacked gate memory cell having program and erase times approaching that of a DRAM cell.

To accomplish these and other objects a stacked gate memory cell is fabricated upon a semiconductor substrate. A deep diffusion well is implanted in the semiconductor substrate. Next a second diffusion well of a second conductivity type is implanted in the deep diffusion well. A MOS transistor is formed by implanting a drain diffusion and a source diffusion in the second diffusion well at a channel length apart. The source will be strapped to the second diffusion well. A tunnel oxide is placed on a top surface of the semiconductor substrate in a channel area between the source and drain. The channel length is the length of the channel area. A gate electrode of a first polysilicon material, placed on the tunnel oxide above the channel area.

An insulating layer is then placed on the surface of the semiconductor substrate. The insulating layer will have a plurality of openings to allow connections to the second diffusion well, the source diffusion, the drain diffusion, and the gate electrode.

A stacked capacitor is formed above the MOS Transistor on the surface of the insulating layer. The stacked capacitor has a first plate of a second polysilicon material deposited upon the insulating layer and connected by a shorting plug to the gate electrode through one of the plurality of opening in the insulating layer. The gate electrode and the first plate will form a floating gate for the MOS transistor. A capacitor dielectric placed upon the first plate; and a second plate of a third polysilicon material placed on the capacitor dielectric. The second plate will form a control gate for the MOS transistor.

The source diffusion and the second diffusion well will be connected to a source control voltage generator. The drain diffusion will be connected to a bit line voltage generator and the top plate of the capacitor that is the control gate of MOS transistor will be controlled to a word line voltage generator. The deep n-well diffusion will be connected to a deep diffusion voltage generator. The source control voltage generator, the bit line voltage generator, the word line voltage generator, and the deep diffusion voltage generator will be adjusted to control the programming, erasing, and sensing of digital data within the stacked gate memory cell.

Further a plurality of stacked gate memory cells will be arranged in an array of rows and columns with the source control voltage generator, the bit line voltage generator, the word line voltage generator, the deep diffusion voltage generator, sense amplifiers and peripheral circuitry to form an integrated circuit memory. The sense amplifiers will sense the digital data present in the stacked gate memory cell. The peripheral circuitry will control the source control voltage generator, the bit line voltage generator, the word line voltage generator, and the deep diffusion voltage generator and the sense amplifiers.

BRIEF DESCRIPTION OF THE DRAWINGS

FIGS. 1a and 1b are respectively a cross sectional drawing and a schematic diagram of a DRAM of prior art.

FIGS. 2a and 2b are respectively a cross sectional drawing and a schematic diagram of a flash EEPROM of prior art.

FIG. 3b is a diagram of a cross sectional view along section 3b–3b' of FIG. 3a.

FIG. 3c is a diagram of a cross sectional view along section 3c–3c' of FIG. 3a.

DETAILED DESCRIPTION OF THE INVENTION

Figure 3A:
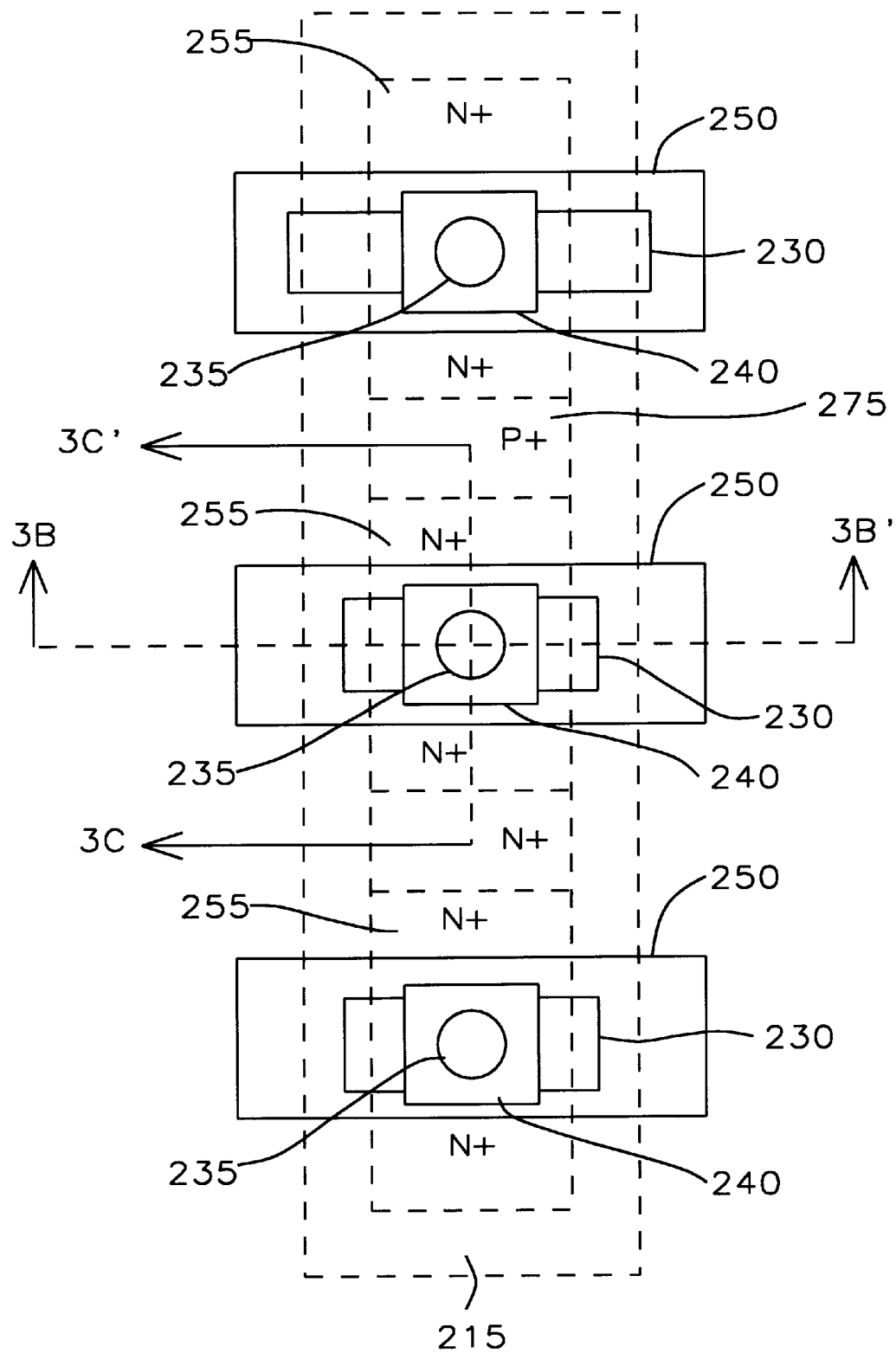
FIG. 3a is a diagram of a top view of a stacked gate memory cell of this invention.
Figure 3B:
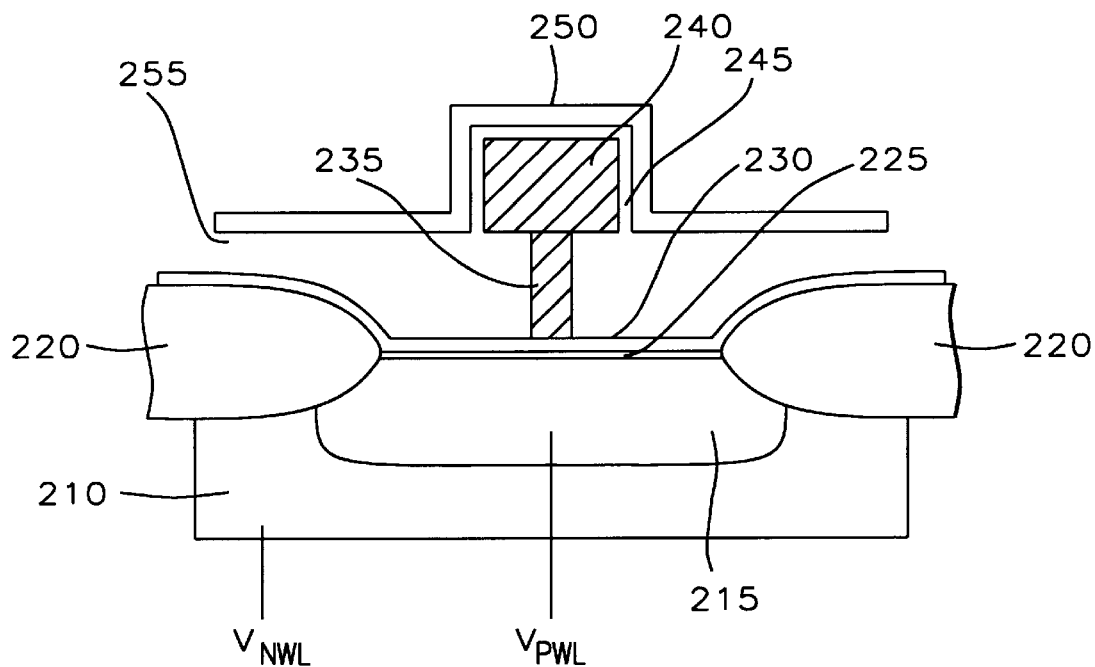
Figure 3C:
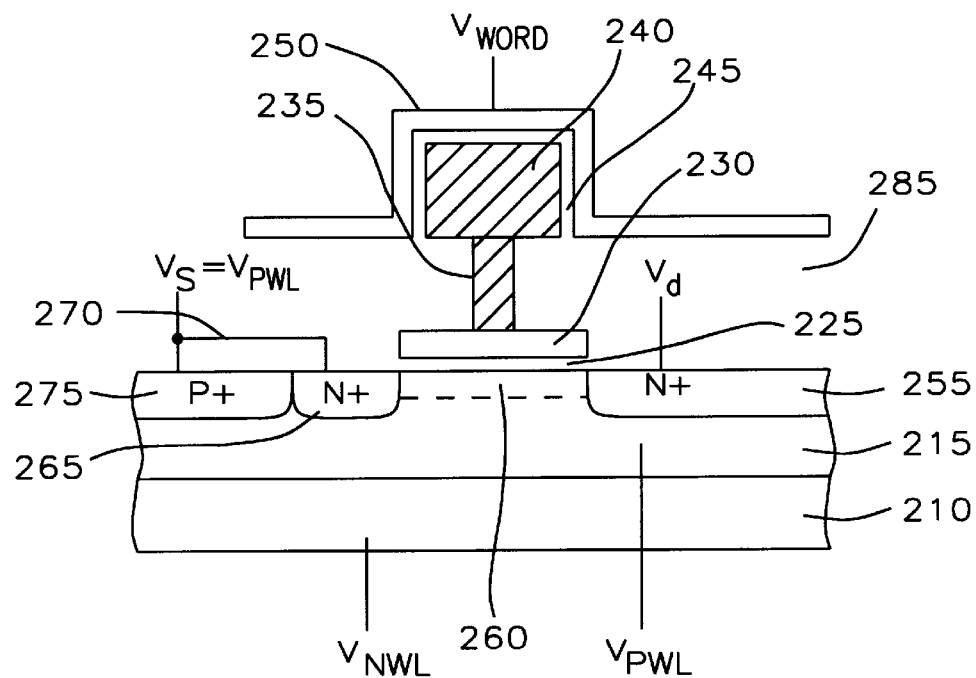
Figure 3D:
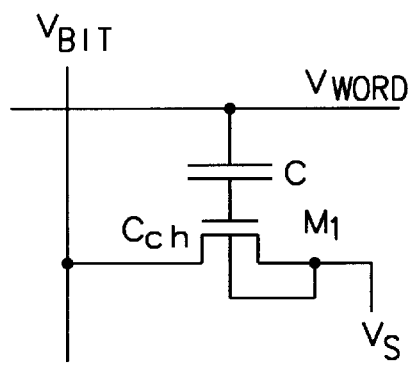
FIG. 3d is a schematic diagram of the stacked gate memory cell of this invention.

To understand the structure of the stacked gate memory cell of this invention refer now to FIGS. 3a, 3b, 3c, and 3d. FIG. 3a illustrates a top surface view of three stacked gate memory cell on the surface of a semiconductor substrate. FIGS. 3b and 3c show cross sectional views of a single stacked gate memory cell receptively along section lines 3B–3B' and 3C–3C'. FIG. 3d shows schematically the stacked gate memory cell of this invention.

The area for the three stacked gate memory cells is defined as an opening in the field oxide 220 grown on the surface of the semiconductor substrate 210. Within the opening, an n-type material will be implanted to form a deep n-well 210. An area within the deep n-well 210 will then be masked and implanted with a p-type material to form a p-well 215. Areas within the p-well 215 are masked and implanted with an n-type material to form the n$^+$ source diffusion 265 and the n$^+$ drain diffusion 255. Adjacent to the n$^+$ source diffusion 265, an area is masked and implanted with a p-type material to form a p$^+$ contact 275 to the p-well 215.

On the surface of the semiconductor substrate 210, above the channel 260 between the n$^+$ source diffusion 265 and the n$^+$ drain diffusion 255, a layer of insulating material such as silicon dioxide, or oxidized silicon nitride is grown. This insulating layer will form the tunnel oxide 225 of the stacked gate memory cell.

A first layer of polysilicon P$_1$ is deposited over the tunnel oxide 225 to form a gate 230. The gate 230, the n$^+$ drain diffusion 255, and the n$^+$ source diffusion 265 for MOS transistor M$_1$ of FIG. 3d.

Over the gate 230 and the remainder of the surface of the semiconductor substrate, an insulating layer 285 such as silicon dioxide is deposited. On the insulating layer 285, contacts (referred to as plug contacts) are opened using a masking step followed by an oxide etching. A second layer of polysilicon P$_2$ is deposited and etched to form a plug (P$_2$ plug) 235. A third layer of polysilicon P$_3$ 240 is formed above the P$_2$ plug 235. The third polysilicon layer P$_3$ 240 will form the bottom plate of the capacitor C as illustrated in FIG. 3d.

The gate 230, the P$_2$ plug 235 and bottom plate 240 form the floating gate of the stacked gate memory cell and will store the charge necessary to retain the digital data in the stacked gate memory cell.

Above the third polysilicon layer P$_3$ 240 a thin insulating layer is deposited to form the capacitor dielectric 245 for the capacitor C as illustrated in FIG. 3d. A fourth polysilicon layer P$_4$ 250 is deposited on the capacitor dielectric. The fourth polysilicon layer P$_4$ 250 will form the top plate of the capacitor C, which is the control gate for the memory cell M$_1$.

A deep diffusion voltage generator V$_{nwl}$ will be connected to the deep n-well 210 to provide necessary voltage biasing to isolate the stacked gate memory cell from other circuitry on the semiconductor substrate. The deep diffusion n-well 210 will generally be at the level of the power supply voltage source (V$_{cc}$).

A p-well diffusion voltage generator V$_{pwl}$ is connected to the p-well diffusion 215. However, for the configuration of this invention the p-well diffusion 215 will be strapped 270 by a metal layer (not shown) to the n$^+$ source diffusion 265 as shown in FIG. 3c. The p$^+$ contact 275, and the p-well diffusion 215 and the n$^+$ source diffusion 265 are connected to p-well diffusion voltage generator V$_{pwl}$ (i.e. V$_s$=V$_{pwl}$). The p-well diffusion 215 is formed for each column of an array of stacked gate memory cells. The p-well diffusion voltage generator V$_{pwl}$ can be individually applied to each column of the array of stacked gate memory cells.

The n$^+$ drain diffusion 255 is connected to a drain control voltage generator V$_d$. In the structure of this stacked gate memory cell of this invention, the drain control voltage generator V$_d$ will be the bit line voltage generator V$_{bit}$. Attached to the fourth polysilicon layer P$_4$ 250 is a word line voltage generator V$_{word}$.

It will be apparent to those skilled in the art that the above described process to form a stacked gate memory cell can be used to form conventional DRAM cells. In fact it will be possible to incorporate the stacked gate memory cell with conventional DRAM cells with in the same integrated circuit chip.

Figure 4:
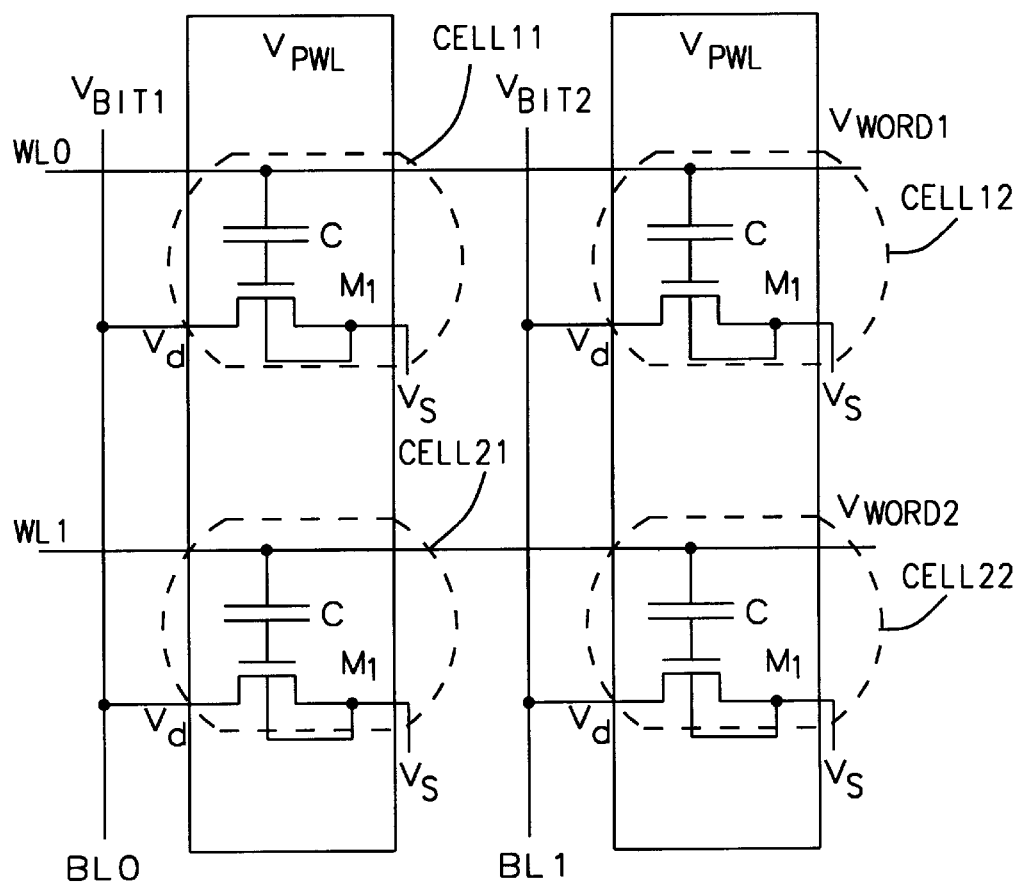
FIG. 4 is a schematic diagram of an array of stacked gate memory cells of this invention.

FIG. 4 is a schematic of an array of four stacked gate memory cells. Stacked gate memory cells 11 and 12 form a first row of memory cells controlled by word line voltage generator V$_{word1}$ and stacked gate memory cells 21 and 22 for a second row controlled by word line voltage generator V$_{word2}$. The stacked gate memory cells 11 and 21 form a first column controlled by bit line voltage generator V$_{bit1}$ and the stacked gate memory cells 12 and 22 for a second column controlled by bit line voltage generator V$_{bit2}$.

Figure 5A:
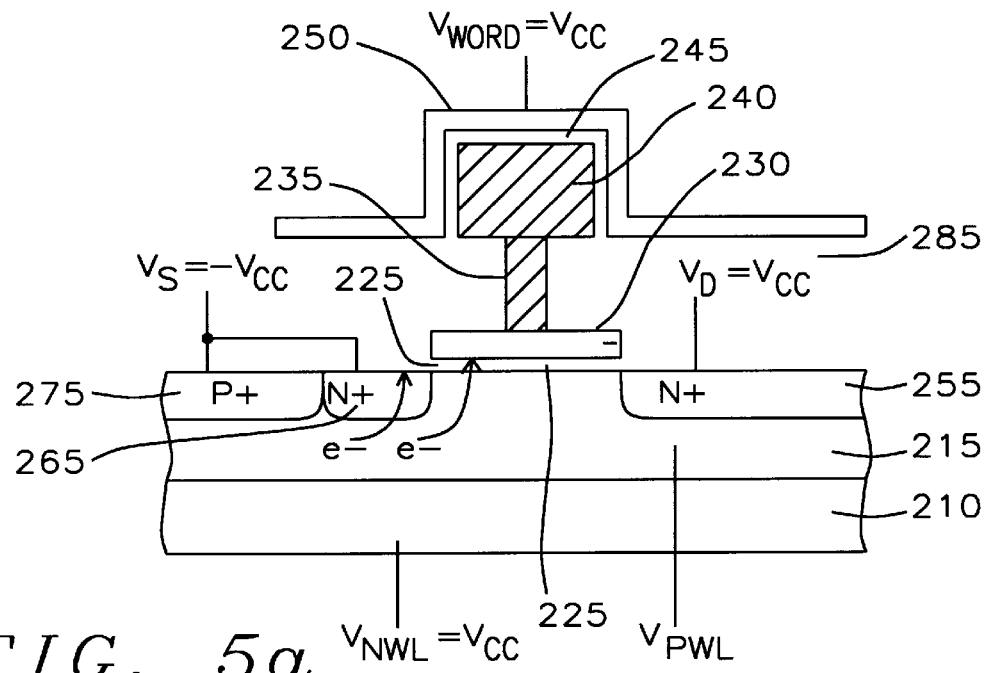
FIG. 5a is a cross sectional diagram of the stacked gate memory cells of this invention during a programming of a logical "1".
Figure 5B:
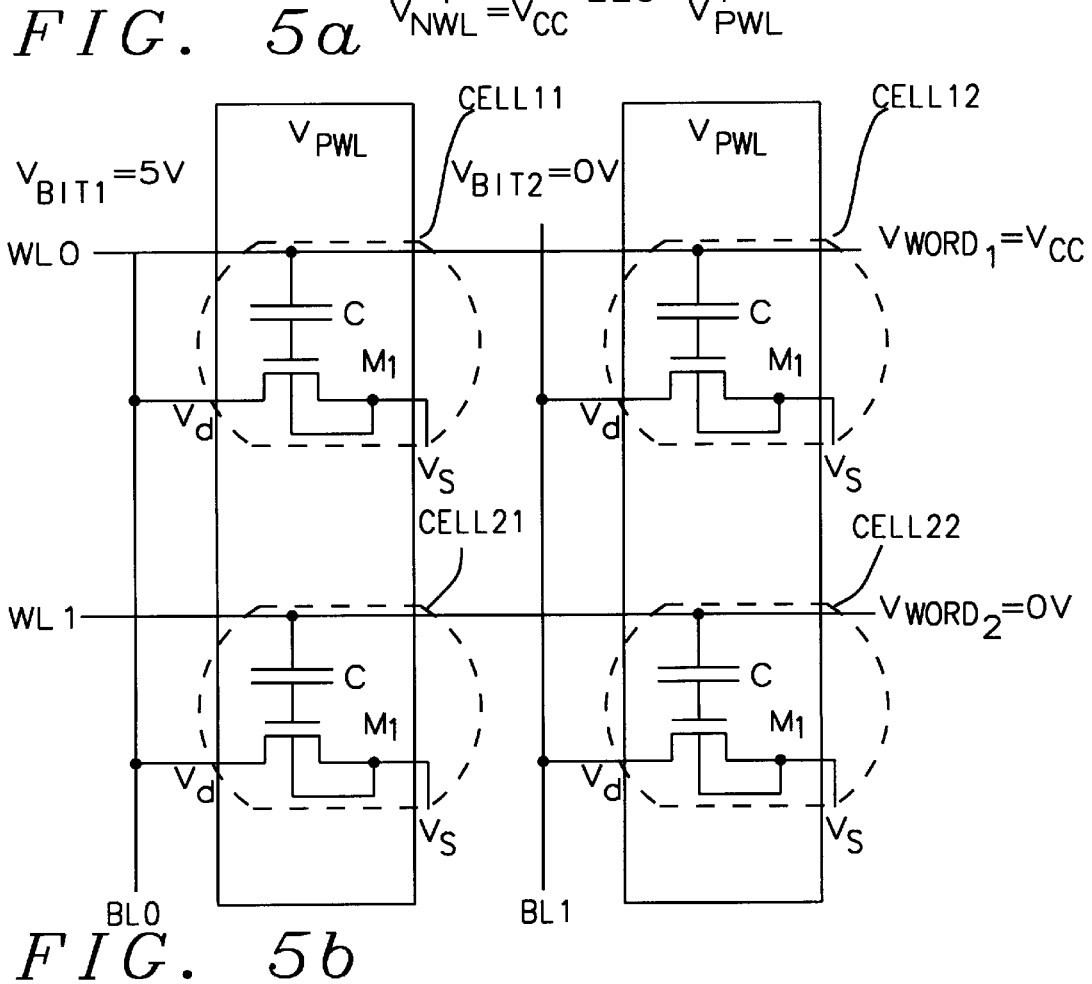
FIG. 5b is a schematic diagram of the array of stacked gate memory cells of this invention during the programming of a logical "1".

The programming of a stacked gate memory cell 11 is shown in FIG. 5a and 5b. To program a logical "1" to the cell 11 (i.e. inject electrons to the floating gate of cell 11) the bit line voltage generator V$_{bit1}$ is set to a level that the negative of the power supply voltage source (-V$_{cc}$). The word line voltage generator V$_{word1}$ is set to a level that is the power supply voltage source (+V$_{cc}$). The source control voltage generator V$_s$ will be set also to the level of the negative of the power supply voltage source (-V$_{cc}$).

By placing the bit line voltage generator V$_{bit1}$ and the source control voltage generator V$_s$ at the level of the negative of the power supply voltage source (-V$_{cc}$, The n$^+$ source diffusion 265, and the n$^+$ drain diffusion 255 and the p-well 215 will be at the voltage level of the negative of the power supply voltage source. The setting of the word line voltage generator V$_{word1}$ to the level of the power supply voltage source (+V$_{cc}$) places the fourth polysilicon layer P$_4$ 250 (the top plate of the capacitor C) at the level of the power supply voltage source V$_{cc}$. These conditions will cause an electrical field to be developed between the fourth polysilicon layer P$_4$ 250 (the top plate of the capacitor C) and the n$^+$ source diffusion 265, and the n$^+$ drain diffusion 255 and the p-well 215. The electric field will cause a Fowler-Nordheim tunneling, which allows electrons e⁻ to flow through the tunnel oxide 225 to the floating gate 230. These electrons will be trapped on the floating gate 230 when the bit line voltage generator $V_{bit1}$, the word line voltage generator $V_{word1}$, and the source control voltage generator $V_s$ is returned to the level of the ground reference potential (0V). This will cause a shift in the threshold voltage $V_T$ of the memory cell $M_1$ of FIG. 3d. The shift in the threshold voltage $V_T$ will be detected during a read operation by sense amplifiers external to the stacked gate memory cell array as a logical 1.

The programming of a logical "0" to the stacked gate memory cell is actually the erasure of a single cell. In nonvolatile terminology "programming" means a method to put electrons on to the floating gate. "Erase" means a method to remove electrons from the floating gate. To "write" logical "1" or "0" is done by programming or erase respectively. For typical flash memory and EPROM, the entire array is erased first to a logical "0" then only logical 1's are "written" or "programmed" into the array. For EEPROM with single cell program and erase capability, then each cell can be written with logical "1" or "0".

Unselected cells are inhibited from programming by setting the combination of the levels of the bit line voltage generator $V_{bit1}$, the word line voltage generator $V_{word1}$, and the source control voltage generator $V_s$ for each cell can be set to any of the voltages of Table 1 to inhibit programming of an unselected cell.

TABLE 1

| Program Inhibit | $V_{bit}$ | $V_{word}$ | $V_s = V_{pwl}$ | $V_{nwl}$ |
|---|---|---|---|---|
| Cell 22 | 0.0V | 0.0V | 0.0V | $V_{CC}$ |
| Cell 21 | $-V_{CC}$ | 0.0V | $-V_{CC}$ | $V_{CC}$ |
| Cell 12 | 0.0V | $V_{CC}$ | 0.0V | $V_{CC}$ |

To program an entire row of stacked gate memory cells, The word line voltage generator $V_{word}$ attached to the row is placed at the level of the power supply voltage source ($V_{cc}$) and the bit line voltage generators $V_{bit}$ and the source control voltage generators $V_s$ connected to each cell of the row is placed to the level of the negative of the power supply voltage source ($-V_{cc}$) if the cell is to be programmed to a logical "1" or to the level of the ground reference potential (0V) if the cell is to be programmed to a logical "0". Alternatively, an entire column can be programmed by placing the bit line voltage generator $V_{bit}$ for the column and the source control voltage generators for each cell in the column at the level of the negative of the power supply voltage source ($-V_{cc}$). The word line voltage generator for each cell within the column will be placed at the level of the power supply voltage source ($V_{cc}$) for cells to be programmed to a logical "1" or to the level of the ground reference potential for cells to be programmed to a logical "0".

Figures 6A, 6B:
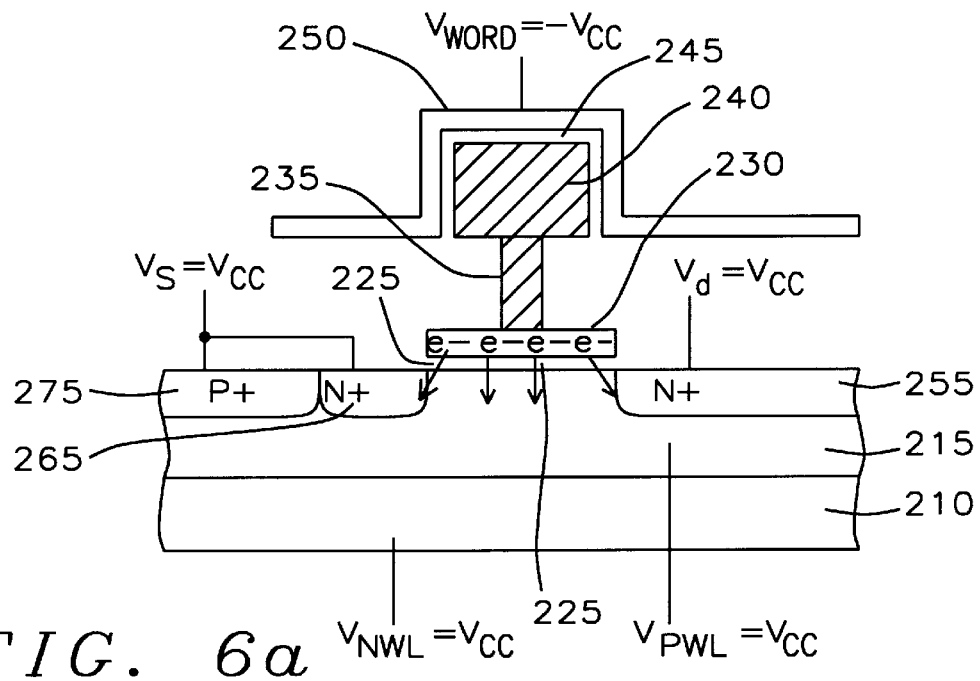
FIG. 6a is a cross sectional diagram of the stacked gate memory cells of this invention during an erase operation.
FIG. 6b is a schematic diagram of the array of stacked gate memory cells of this invention during the erase operation.

To erase a cell or to remove any charge from the floating gate refer now FIGS. 6a and 6b. To erase the stacked gate memory cell 11, the word line voltage generator $V_{word1}$ will be placed at the level of the negative of the power supply voltage source ($-V_{cc}$). The bit line voltage generator $V_{bit1}$ and the source control voltage generator $V_{s11}$, will be set at the level of the power supply voltage source ($V_{cc}$). The setting of the bit line voltage generator $V_{bit1}$, the word line voltage generator $V_{word1}$, and the source control voltage generator $V_{s11}$ as described will establish an electric field between the third polysilicon layer $P_4$ 250 (the top plate of the capacitor C) and the n⁺ drain diffusion 255, the n⁺ source diffusion 265, and the p-well 215. The electric field passing through the tunnel oxide 225 will force the electrons e⁻ trapped on the floating gate 230 to transfer through the tunnel oxide 225 by Fowler-Nordheim tunneling to the n⁺ drain diffusion 255, the n⁺ source diffusion 265, and the p-well 215, thus eliminating any trapped electrons e⁻ from the floating gate 230. The removal of the trapped charges e⁻ from the floating gate 230 will restore the threshold voltage $V_T$ of the memory cell $M_1$.

The cells that are not to be erased will have their respective bit line voltage generators $V_{bit}$, the word line voltage generators $V_{word}$, and the source control voltage generators $V_s$ set according to the voltage levels of Table 2.

TABLE 2

| Erase Inhibit | $V_{bit}$ | $V_{word}$ | $V_s = V_{pwl}$ | $V_{nwl}$ |
|---|---|---|---|---|
| | 0.0V | 0.0V | 0.0V | $V_{CC}$ |
| | $V_{CC}$ | 0.0V | $V_{CC}$ | $V_{CC}$ |

These voltage levels will insure that cells that are not to be erased will not have a sufficient field within the tunnel oxide to initiate the Fowler-Nordheim tunneling.

An entire row of cells can be erased by placing the word line voltage generator $V_{word}$ for that row at the level of the negative of the power supply voltage source ($-V_{cc}$) and the bit line voltage generators and the source control voltage generators $V_s$ connected to each cell in the row to be erased at the level of the power supply voltage source ($V_{cc}$). The cells of the row will be erased as above described for a single cell.

Alternatively, an entire column can be erased by placing all the word line voltage generators $V_{word}$ for each cell attached to the column at the level that is the negative of the power supply voltage source ($-V_{cc}$). The bit line voltage generator $V_{bit}$ and the source control voltage generator $V_s$ of the column to be erased will be set to the level of the power supply voltage source ($V_{cc}$). The cells of the column will be erased as above described for the single cell.

An entire array can be erased by placing all the word line voltage generators $V_{word}$ at the level of the negative of the power supply voltage source ($-V_{cc}$). All the bit line voltage generators $V_{bit}$ and all the source control voltage generators $V_s$ will be set to the level of the power supply voltage source ($V_{cc}$). And again as described above for an individual cell, the entire array will be erased.

Refer now back to FIG. 4. The reading of digital data stored within the array of stacked gate memory cells will be accomplished by setting the source control voltage generator $V_{s11}$ to the level of the ground reference potential (0V). The word line voltage generator $V_{word1}$ will be placed at the level of the power supply voltage source ($V_{cc}$) and the bit line voltage generator will be precharged to a voltage level that is one half the level of the power supply voltage source ($V_{cc}/2$).

If the stacked gate memory cell 11 is erased or programmed to a logical "0", the threshold voltage $V_T$ of the memory cell will be sufficiently low such that MOS transistor $M_1$ will conduct. This will be sensed by a sense amplifier (not shown) attached to the bit line as a logical "0". However, if the stacked gate memory cell 11 is programmed to a logical "1", the threshold voltage $V_T$ of the memory cell will be sufficiently high that the MOS transistor $M_1$ will not conduct. In this case the voltage present on the bit line ($V_{cc}/2$) will not change and the sense amplifier attached to the bit line will detect this as a logical "1".

The control of the settings of the bit line voltage generators $V_{bit}$, the word line voltage generators $V_{word}$, the source control voltage generators $V_s$, and the sense amplifiers will be provided by peripheral circuitry (not shown) external to the stacked gate memory array.

The article entitled "High Endurance Ultra-Thin Tunnel Oxide For Dynamic Memory", C. Wann and C. Hu, Proceedings of IEDM, IEEE, 1995, p. 867, describes that having ultra thin tunnel oxides will allow very rapid Fowler-Nordheim tunneling during programming and erasing of the memory cell. Thus if the tunnel oxide of this invention is on the order of 60–70 Å, the program and erase times will be on the order of approximately 10 ns to approximately 100 ns. The stacked gate memory cell structure of this invention is similar to that described in El-Kareh et al. will have a high coupling ratio ($\gamma$) (approximately 0.95) due to the large capacitance.

The control gate coupling ratio ($\gamma$) is defined as the ratio of the capacitance from control gate to the floating gate C divided by the total capacitive seen by the floating gate ($C_{tot}$) where:

$$C_{tot} = C + C_{ch} + \text{other stray capacitances}$$

The capacitance $C_{ch}$ is the capacitance between the floating gate 230 and the channel 260. Thus the coupling ratio is:

$$\gamma = \frac{C}{C_{tot}} = \frac{C}{C + C_{ch}}$$

In the stacked gate memory cell of this invention, the capacitor C will have a value of approximately 30 fF, while the capacitance between the floating gate 230 and the channel 260 has a value of approximately 1 fF. The coupling ratio ($\gamma$) will then be approximately 0.97. A large value of the coupling ration ($\gamma$) results in an easier control of the floating gate potential by the biasing of the control gate. The floating gate potential ($V_{fg}$) can be expressed as:

$$V_{fg} = \gamma V_{word} + (1-\gamma)V_{pwl} + \frac{Q}{C_{tot}} \approx V_{word} + \frac{Q}{C_{tot}}$$

where Q is the net electron charge on the floating gate.
Thus if there is a negative charge on the floating gate, the $V_{fg} \approx V_T$. The voltage at threshold of the word control voltage generator $V_{word}$ is:

$$V_{word} = V_T + \frac{C}{C_{tot}}$$

The thin tunnel oxide (60–70 Å) as above described and operated at $V_{cc}$ of 5 V will be sufficiently thin as to preclude long (>1 month) data retention.

The design of the tunnel oxide of the stacked gate memory cell of this invention will allow a structure with a long retention and relatively long program and erase times as in an EEPROM. Or to have a relatively shorter retention time, but much fast program and erase times to function as a DRAM. The retention time may be shorter than that of an EEPROM (10 years) but it will be significantly longer than that of a DRAM (200 ms). The DRAM like EEPROM can be useful for data storage applications that have infrequent write operations for low power applications. The stored data is non-volatile even after a short period (~1 month) of having no power supply voltage source.

Figure 7A:
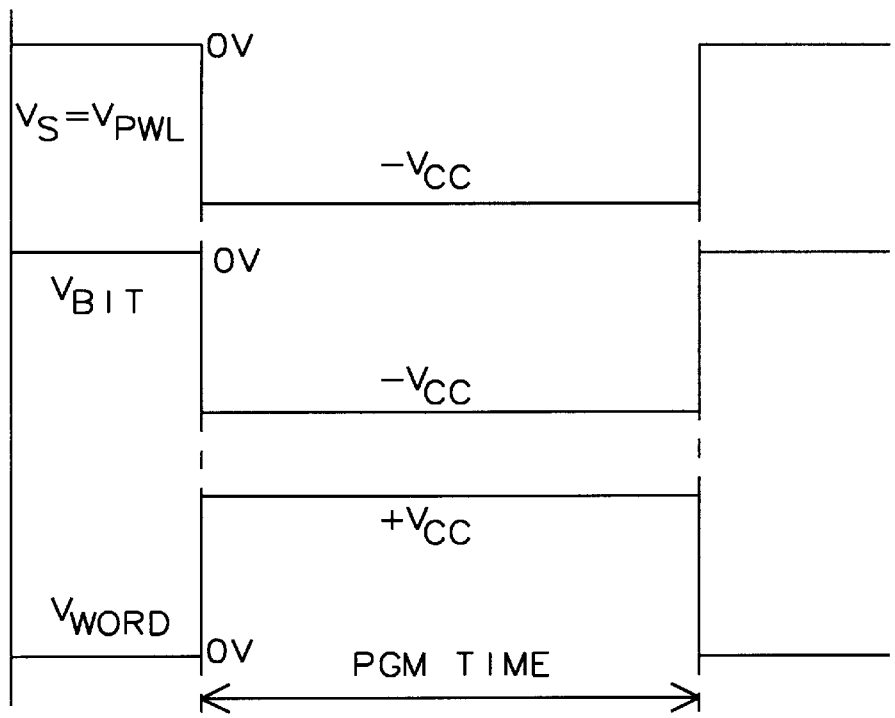
FIGS. 7a and 7b are timing diagrams of the programming and erase cycle of the stacked gate memory cell of this invention.
Figure 7B:
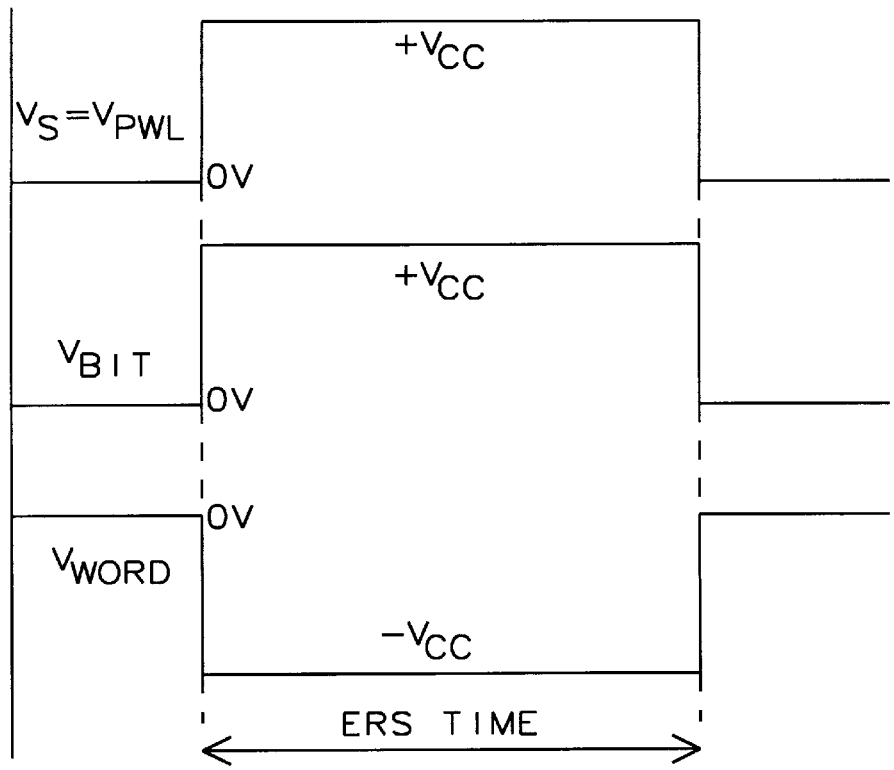

Refer now to FIGS. 7a and 7b to review the timing of a programming operation and an erase operation of a stacked gate memory cell of this invention. First in FIG. 7a, the source control voltage generator $V_s$ and the p-well diffusion voltage generator $V_{pwl}$ is brought to a voltage level that is a negative value of the power supply voltage source $(-V_{cc})$ at the beginning of a programming operation, likewise the bit line voltage source $V_{bit}$ will be brought to a voltage level that is a negative value of the power supply voltage source $(-V_{cc})$ at this time. The word line control voltage source $V_{word}$ will brought to the level of the power supply voltage source. The bit line voltage source $V_{bit}$ will be brought to a high impedance state once the channel has been inverted that is when the source control voltage generator $V_s$ and the p-well diffusion voltage generator $V_{pwl}$ are brought to a voltage level that is a negative value of the power supply voltage source $(-V_{cc})$ and the word line control voltage source $V_{word}$ is brought to the level of the power supply voltage source.

The programming time will be greater than 10 msec for stacked gate memory cells where the tunneling oxide is thicker, approximately 100 Å. The programming time will be less than 10 nsec for stacked gate memory cells where the tunneling oxide is thinner, approximately 60–70 Å.

In FIG. 7b, the erase operation is accomplished by bringing the source control voltage generator $V_s$ and the p-well diffusion voltage generator $V_{pwl}$ is brought to a voltage level that is the power supply voltage source ($V_{cc}$) at the beginning of a programming operation, likewise the bit line voltage source $V_{bit}$ will be brought to a voltage level that is the power supply voltage source ($V_{cc}$) at this time. The word line control voltage source $V_{word}$ will brought to a voltage level that is a negative of the level of the power supply voltage source $(-V_{cc})$. The bit line voltage source $V_{bit}$ will be brought to a high impedance state once the source control voltage generator $V_s$ and the p-well diffusion voltage generator $V_{pwl}$ are brought to the power supply voltage source ($V_{cc}$). The p-well to bit line junction will be slightly forward biased thus quickly clamping the bit line voltage source $V_{bit}$ to the level of the power supply voltage source $V_{cc}$.

While this invention has been particularly shown and described with reference to the preferred embodiments thereof, it will be understood by those skilled in the art that various changes in form and details may be made without departing from the spirit and scope of the invention.

The invention claimed is:

1. A method to fabricate a stacked gate memory cell comprising the steps of:
    a) implanting a deep diffusion well of a first conductivity type in the semiconductor substrate and connecting said deep diffusion well to a deep diffusion voltage generator;
    b) implanting a second diffusion well of a second conductivity type in the deep diffusion well;
    c) forming a MOS transistor by the steps of:
        implanting a drain diffusion of the first conductivity type in the second diffusion well and connecting said drain diffusion to a bit line voltage generator,
        implanting a source diffusion of the second conductivity type in the second diffusion well at a channel length from the drain diffusion, strapped to said second diffusion well, and coupling said source diffusion to a source control voltage generator;
        depositing a tunnel oxide on a top surface of said semiconductor substrate in a channel area, whereby the channel length is a length dimension of the channel area, that is between said drain diffusion and said source diffusion, and
        depositing a gate electrode of a first polysilicon material on the tunnel oxide above the channel area;

d) depositing an insulating layer on the surface of said semiconductor substrate with a plurality of openings to allow connections to said second diffusion well, said source diffusion, said drain diffusion, and said gate electrode; and e) forming a stacked capacitor by the steps of:

depositing a first plate of a second polysilicon material upon said insulating layer and connecting said first plate by a shorting plug to said gate electrode through one of the plurality of openings in said insulating layer, whereby said gate electrode and said first plate will form a floating gate for said MOS transistor, depositing a capacitor dielectric placed upon said first plate, and depositing a second plate of a third polysilicon material on said capacitor dielectric and coupling said second plate to a word line voltage generator, whereby said second plate will form a control gate for said MOS transistor.

2. The method of claim 1 wherein said stacked gate memory cell has a retention time greater than the retention time of a DRAM cell.

3. The method of claim 2 wherein said retention time is greater than approximately 200 ms.

4. The method of claim 2 wherein the retention time is less than the retention time of a EEPROM cell.

5. The method of claim 2 wherein the retention time is less than 10 years.

6. The method of claim 1 wherein a programming time is between approximately 10 ns and approximately 10 ms.

7. The method of claim 1 wherein an erase time is between approximately 10 ns and approximately 10 ms.

8. The method of claim 1 wherein said deep diffusion generator is a power supply voltage source.

9. The method of claim 1 wherein said memory cell is a DRAM cell.

10. The method of claim 1 wherein said memory cell is a EEPROM cell.

11. The method of claim 1 wherein said memory cell is programmed to a logical "1" by placing said bit line voltage generator at a level that is a negative of the power supply voltage source, placing said word line voltage generator at a level that is the power supply voltage source, placing said source control voltage generator at the level that is the negative of the power supply voltage source, and placing the deep diffusion voltage generator at the level of the power supply voltage source.

12. The method of claim 1 wherein said memory cell is programmed to a logical "0" by placing said bit line voltage generator at a ground reference potential, placing said word line voltage generator at a level that is the power supply voltage source, placing said source control voltage generator at the level that is the negative of the power supply voltage source, and placing the deep diffusion voltage generator at the level of the power supply voltage source.

13. The method of claim 1 wherein said memory cell is erased by placing said word line generator at the level that is the negative of the power supply voltage source, placing said bit line generator at a the level that is the power supply voltage source, placing said source control voltage generator at the level that is the negative of the power supply voltage source, and said deep diffusion voltage generator at the level of the power supply voltage source.

14. The method of claim 9 wherein said tunnel oxide has a thickness that is from approximately 60 Å to approximately 70 Å.

15. The method of claim 10 wherein said tunnel oxide has a thickness that is from approximately 100 Å.

16. The method of claim 1 wherein said memory cell has a coupling ratio of approximately 0.95.

* * * * *